(12) United States Patent
Tao et al.

(10) Patent No.: US 8,304,170 B2
(45) Date of Patent: Nov. 6, 2012

(54) NEGATIVE-WORKING IMAGEABLE ELEMENT AND METHOD OF USE

(75) Inventors: Ting Tao, Fort Collins, CO (US); Eric E. Clark, Loveland, CO (US)

(73) Assignee: Eastman Kodak Company, Rochester, NY (US)

( * ) Notice: Subject to any disclaimer, the term of this patent is extended or adjusted under 35 U.S.C. 154(b) by 373 days.

(21) Appl. No.: 12/204,102

(22) Filed: Sep. 4, 2008

(65) Prior Publication Data

US 2010/0055414 A1    Mar. 4, 2010

(51) Int. Cl.
*G03F 7/00* (2006.01)
*G03F 7/26* (2006.01)

(52) U.S. Cl. .......... 430/302; 430/281.1; 430/270.1; 101/450.1; 101/453; 101/463.1

(58) Field of Classification Search ............. 430/270.1, 430/281.1, 30; 101/453
See application file for complete search history.

(56) References Cited

U.S. PATENT DOCUMENTS

| | | | |
|---|---|---|---|
| 6,232,038 B1 * | 5/2001 | Takasaki et al. ........... 430/281.1 |
| 7,172,850 B2 | 2/2007 | Munnelly et al. | |
| 7,175,969 B1 | 2/2007 | Ray et al. | |
| 7,338,741 B2 | 3/2008 | Aoshima et al. | |
| 2004/0260050 A1 * | 12/2004 | Munnelly et al. .............. 528/176 |
| 2005/0170286 A1 | 8/2005 | Huang et al. | |
| 2007/0092836 A1 * | 4/2007 | Inno et al. .................. 430/270.1 |
| 2008/0008957 A1 * | 1/2008 | Munnelly et al. .......... 430/270.1 |
| 2009/0004595 A1 * | 1/2009 | Munnelly ................... 430/270.1 |
| 2009/0098482 A1 | 4/2009 | Ray et al. | |

FOREIGN PATENT DOCUMENTS

| | | |
|---|---|---|
| DE | 37 38 215 A1 | 5/1988 |
| DE | 3738215 A1 * | 5/1988 |
| EP | 1754597 A2 * | 2/2007 |
| EP | 1 764 651 A2 | 3/2007 |
| EP | 1788431 | 5/2007 |
| EP | 1788448 | 5/2007 |
| JP | 2002055447 A | 2/2002 |
| WO | WO 2007/057409 A1 | 5/2007 |
| WO | WO 2007057409 A1 * | 5/2007 |

* cited by examiner

*Primary Examiner* — Cynthia Kelly
*Assistant Examiner* — Chanceity Robinson
(74) *Attorney, Agent, or Firm* — J. Lanny Tucker

(57) ABSTRACT

Negative-working imageable elements can be imaged and processed to provide lithographic printing plates, especially with sulfuric acid-anodized aluminum substrates. These elements have an imageable outermost layer that contains two different polymeric binders, a primary polymeric binder is optionally present a discrete particles, and a secondary polymeric binder comprising a poly(vinyl acetate) that has a degree of hydrolysis of less than 60 mol %. These imageable elements can be designed for either off-press or on-press development.

12 Claims, No Drawings

NEGATIVE-WORKING IMAGEABLE ELEMENT AND METHOD OF USE

FIELD OF THE INVENTION

This invention relates to negative-working imageable elements such as negative-working lithographic printing plate precursors containing a unique combination of polymeric binders in the imageable layer. The invention also relates to method of using these imageable elements.

BACKGROUND OF THE INVENTION

Radiation-sensitive compositions are routinely used in the preparation of imageable materials including lithographic printing plate precursors. Such compositions generally include a radiation-sensitive component, an initiator system, and a binder, each of which has been the focus of research to provide various improvements in physical properties, imaging performance, and image characteristics.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

Various negative-working radiation compositions and imageable elements containing polymer binders are known in the art. Some of these compositions and elements are described for example in U.S. Pat. No. 6,569,603 (Furukawa), U.S. Pat. No. 6,309,792 (Hauck et al.), U.S. Pat. No. 6,582,882 (Pappas et al.), U.S. Pat. No. 6,787,281 (Tao et al.), U.S. Pat. No. 6,899,994 (Huang et al.), U.S. Pat. No. 7,175,969 (Ray et al.), U.S. Pat. No. 7,172,850 (Munnelly et al.), U.S. Pat. No. 7,332,253 (Tao et al.), U.S. Pat. No. 7,326,521 (Tao et al.), U.S. Patent Application Publications 2003/0118939 (West et al.), 2005/0003285 (Hayashi et al.), and 2007/0184380 (Tao et al.), and EP 1,079,276A1 (Lifka et al.), and EP 1,449,650A1 (Goto).

Partially hydrolyzed poly(vinyl acetate) has also been used as a binder in imageable elements as described for example in EP 1,788,448A1 (Williamson), but these elements require the presence of a water-soluble poly(vinyl alcohol) overcoat (outermost layer). In addition, U.S. Pat. No. 7,338,741 (Aoshima et al.) describes the use of poly(vinyl acetate) with a degree of hydrolysis of at least 80 mol %.

PROBLEM TO BE SOLVED

While many of the negative-working imageable elements described in the art have numerous advantages to provide lithographic printing plates, there remains a need for further improvements. For example, when the imageable elements have an imageable layer disposed on a sulfuric acid-anodized aluminum substrate, non-imaged areas in on-press developable compositions sometimes show "background staining" after accelerated aging in humid conditions. There is also a desire to have good shelf life without the presence of an outermost overcoat that normally serves as an oxygen barrier.

SUMMARY OF THE INVENTION

This invention provides a negative-working imageable element comprising a substrate having thereon an imageable layer as the outermost layer, the imageable layer comprising:
a free radically polymerizable component,
an initiator composition capable of generating radicals sufficient to initiate polymerization of the free radically polymerizable component upon exposure to imaging radiation,
a radiation absorbing compound,
a primary polymeric binder that is optionally present as discrete particles, and
a secondary polymeric binder comprising a poly(vinyl acetate) that has a degree of hydrolysis of less than 60 mol %.

This invention also provides a method of making an imaged element comprising:
A) imagewise exposing the negative-working imageable element of this invention to form exposed and non-exposed regions,
B) with or without a preheat step, developing the imagewise exposed element to remove predominantly only the non-exposed regions,
the development being carried out either: (a) on-press using a fountain solution, lithographic printing ink, or both, or (b) off-press using an alkaline processing solution.

The method of this invention is useful for providing lithographic printing plates having aluminum-based substrates, especially those with sulfuric acid-anodized aluminum-based substrates.

The present invention provides imageable elements that can be imaged and followed by development either off-press or on-press. This flexibility in usefulness is not a common feature in many elements of the prior art. In addition, the imageable elements demonstrate improved shelf life stability even in humid conditions and also exhibit good image speed and long run length without the need for a post-exposure baking step. Moreover, the common overcoat layer (topcoat) used as an oxygen barrier can be omitted. It is particularly advantageous that the imageable layer composition can be applied to sulfuric acid anodized aluminum-containing substrates that have been treated ("post-treatment") in various ways.

These advantages were unexpectedly achieved by using a combination of polymeric binders in the imageable layer. A primary polymeric binder, which can be optionally in particulate form for on-press developability, is combined with a poly(vinyl acetate) resin that has a degree of hydrolysis of less than 60 mol %.

DETAILED DESCRIPTION OF THE INVENTION

Unless the context indicates otherwise, when used herein, the terms "imageable element" and "lithographic printing plate precursor" are meant to be references to embodiments of the present invention.

In addition, unless the context indicates otherwise, the various components described herein such as "radically polymerizable component", "radiation absorbing compound", "primary polymeric binder", secondary polymeric binder", "initiator", "co-initiator", and similar terms also refer to mixtures of such components. Thus, the use of the articles "a", "an", and "the" are not necessarily meant to refer to only a single component.

Moreover, unless otherwise indicated, percentages refer to percents by dry weight.

The imageable elements of this invention are generally "single-layer" imageable elements by which we mean that the elements contain only one layer that is essential for imaging and this layer is the outermost layer, but such elements may also include one or more layers under the imageable layer for various purposes.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

"Graft" polymer or copolymer refers to a polymer having a side chain that has a molecular weight of from about 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Imageable Layers

The imageable elements include an infrared (IR) radiation-sensitive imaging composition disposed on a suitable substrate to form an imageable layer. The imageable elements may have any utility wherever there is a need for an applied coating that is crosslinkable using suitable infrared radiation, and particularly where it is desired to remove non-exposed regions of the coating instead of exposed regions. The IR radiation-sensitive compositions can be used to prepare an imageable layer in imageable elements such as printed circuit boards for integrated circuits, microoptical devices, color filters, photomasks, and printed forms such as lithographic printing plate precursors that are defined in more detail below.

The free radically polymerizable component used in the IR radiation-sensitive composition consists of one or more compounds that have one or more ethylenically unsaturated polymerizable or crosslinkable groups that can be polymerized or crosslinked using free radical initiation. For example, the free radically polymerizable component can be ethylenically unsaturated monomers, oligomers, and crosslinkable polymers, or various combinations of such compounds.

Thus, suitable ethylenically unsaturated compounds that can be polymerized or crosslinked include ethylenically unsaturated polymerizable monomers that have one or more of the polymerizable groups, including unsaturated esters of alcohols, such as (meth)acrylate esters of polyols. Oligomers and/or prepolymers, such as urethane(meth)acrylates, epoxide(meth)acrylates, polyester(meth)acrylates, polyether (meth)acrylates, free-radical crosslinkable polymers, and unsaturated polyester resins can also be used. In some embodiments, the radically polymerizable component may comprise carboxy groups.

Particularly useful free radically polymerizable components include free-radical polymerizable monomers or oligomers that comprise addition polymerizable ethylenically unsaturated groups including multiple acrylate and methacrylate groups and combinations thereof, or free-radical crosslinkable polymers, or combinations of these classes of materials. More particularly useful free radically polymerizable compounds include those derived from urea urethane (meth)acrylates or urethane (meth)acrylates having multiple polymerizable groups. For example, a most preferred free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Other useful free radically polymerizable compounds include NK Ester A-DPH (dipentaerythritol hexaacrylate) that is available from Kowa American, and free radically polymerizable compounds are available from Sartomer Company, Inc. such as Sartomer 399 (dipentaerythritol pentaacrylate), Sartomer 355 (di-trimethylolpropane tetraacrylate), Sartomer 295 (pentaerythritol tetraacrylate), Sartomer 415 [ethoxylated (20) trimethylolpropane triacrylate], and others that would be readily apparent to one skilled in the art.

Also useful are urea urethane (meth)acrylates and urethane (meth)acrylates described in U.S. Pat. No. 6,582,882 (noted above), U.S. Pat. No. 6,899,994 (noted above), and U.S. Pat. No. 7,153,632 (Saraiya et al.) that are incorporated by reference.

Numerous other free radically polymerizable compounds are known to those skilled in the art and are described in considerable literature including *Photoreactive Polymers: The Science and Technology of Resists*, A Reiser, Wiley, N.Y., 1989, pp. 102-177, by B. M. Monroe in *Radiation Curing: Science and Technology*, S. P. Pappas, Ed., Plenum, N.Y., 1992, pp. 399-440, and in "Polymer Imaging" by A. B. Cohen and P. Walker, in *Imaging Processes and Material*, J. M. Sturge et al. (Eds.), Van Nostrand Reinhold, N.Y., 1989, pp. 226-262. For example, useful free radically polymerizable components are also described in EP 1,182,033A1 (noted above), beginning with paragraph [0170].

The free radically polymerizable component is present in the IR radiation-sensitive composition in an amount sufficient to render the composition insoluble in an aqueous developer after exposure to radiation. This is generally from about 10 to about 70 weight % and typically from about 20 to about 50 weight % based on the dry weight of the radiation-sensitive composition.

The IR radiation-sensitive composition includes an initiator composition that is capable of generating radicals sufficient to initiate polymerization of the radically polymerizable component upon exposure to the imaging radiation. The initiator composition may be responsive, for example, to electromagnetic radiation in the infrared spectral regions, corresponding to the broad spectral range of from about 700 nm to about 1400 nm, and typically from about 700 nm to about 1200 nm.

There are numerous compounds known in the literature that can be used in this manner including but not limited to, organic boron salts, s-triazines, benzoyl-substituted compounds, onium salts (such as iodonium, sulfonium, diazonium, and phosphonium salts), trihaloalkyl-substituted compounds, metallocenes (such as titanocenes), ketoximes, thio compounds, organic peroxides, or a combination of two or more of these classes of compounds.

Other suitable initiator compositions comprise compounds that include but are not limited to, amines (such as alkanol amines), thiol compounds, anilinodiacetic acids or derivatives thereof, N-phenyl glycine and derivatives thereof, N,N-dialkylaminobenzoic acid esters, N-arylglycines and derivatives thereof (such as N-phenylglycine), aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), α-hydroxy or α-amino-acetophenones, alkyltriarylborates, trihalogenomethylarylsulfones, benzoin ethers and esters, peroxides (such as benzoyl peroxide), hydroperoxides (such as cumyl hydroperoxide), azo compounds (such as azo bis-isobutyronitrile) as described for example in U.S. Pat. No. 4,565,769 (Dueber et al.), borate and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts). Other known initiator composition components are described for example in U.S. Patent Application Publication 2003/0064318 (Huang et al.).

The initiator compositions generally comprise an onium salt including but not limited to, a sulfonium, oxysulfoxonium, oxysulfonium, sulfoxonium, ammonium, selenonium, arsonium, phosphonium, diazonium, or halonium salt. Further details of useful onium salts, including representative examples, are provided in U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), U.S. Pat. No. 6,051,366 (Baumann et al.), and U.S. Pat. No. 7,368,215 (Munnelly et al.). For example, suitable phosphonium salts include positive-charged hypervalent phosphorus atoms with four organic substituents. Suitable sulfonium salts such as triphenylsulfonium salts include a positively-charged hypervalent sulfur with three organic substituents. Suitable diazonium salts possess a positive-charged azo group (that is —N=N$^+$). Suitable ammonium salts include a positively-charged nitrogen atom such as substituted quaternary ammonium salts with four organic substituents, and quaternary nitrogen heterocyclic rings such as N-alkoxypyridinium salts. Suitable halonium salts include a positively-charged hypervalent halogen atom with two organic substituents. The onium salts generally include a suitable number of negatively-charged counterions such as halides, hexafluorophosphate, thiosulfate, hexafluoroantimonate, tetrafluoroborate, sulfonates, hydroxide, perchlorate, n-butyltriphenyl borate, tetraphenyl borate, and others readily apparent to one skilled in the art.

The halonium salts are more preferred, and the iodonium salts are most preferred. In one preferred embodiment, the onium salt has a positively-charged iodonium, (4-methylphenyl)[4-(2-methylpropyl)phenyl]-moiety and a suitable negatively charged counterion. A representative example of such an iodonium salt is available as Irgacure® 250 from Ciba Specialty Chemicals (Tarrytown, N.Y.) that is (4-methylphenyl)[4-(2-methylpropyl)phenyl]iodonium hexafluorophosphate and is supplied in a 75% propylene carbonate solution.

Some useful boron components include organic boron salts that include an organic boron anion such as those described in U.S. Pat. No. 6,569,603 (noted above) that is paired with a suitable cation such as an alkali metal ion, an onium, or a cationic sensitizing dye. Useful onium cations include but are not limited to, ammonium, sulfonium, phosphonium, iodonium, and diazonium cations. Iodonium salts and particularly iodonium borates are particularly useful as initiator compounds in radiation-sensitive compounds that are designed for "on-press" development (described in more detail below). They may be used alone or in combination with various co-initiators such as heterocyclic mercapto compounds including mercaptotriazoles, mercaptobenzimidazoles, mercaptobenzoxazoles, mercaptobenzothiazoles, mercaptobenzoxadiazoles, mercaptotetrazoles, such as those described for example in U.S. Pat. No. 6,884,568 (Timpe et al.) in amounts of at least 0.5 and up to and including 10 weight % based on the total solids of the IR radiation-sensitive composition.

The initiator compositions can comprise one or more diaryliodonium borate compounds, each of which is represented by the following Structure (II):

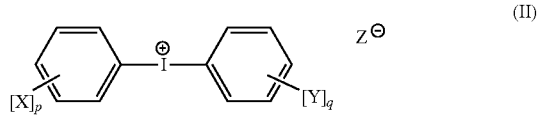

wherein X and Y are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, isopropyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono- and poly-, branched and linear haloalkyls), substituted or unsubstituted alkyloxy having 1 to 20 carbon atoms (for example, substituted or unsubstituted methoxy, ethoxy, iso-propoxy, t-butoxy, (2-hydroxytetradecyl)oxy, and various other linear and branched alkyleneoxyalkoxy groups), substituted or unsubstituted aryl groups having 6 or 10 carbon atoms in the carbocyclic aromatic ring (such as substituted or unsubstituted phenyl and naphthyl groups including mono- and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). For example, X and Y are independently substituted or unsubstituted alkyl groups having 1 to 8 carbon atoms, alkyloxy groups having 1 to 8 carbon atoms, or cycloalkyl groups having 5 or 6 carbon atoms in the ring, and more preferably, X and Y are independently substituted or unsubstituted alkyl groups having 3 to 6 carbon atoms (and particularly branched alkyl groups having 3 to 6 carbon atoms). Thus, X and Y can be the same or different groups, the various X groups can be the same or different groups, and the various Y groups can be the same or different groups. Both "symmetric" and "asymmetric" diaryliodonium borate compounds are contemplated by this invention but the "symmetric" compounds are useful (that is, they have the same groups on both phenyl rings).

In addition, two or more adjacent X or Y groups can be combined to form a fused carbocyclic or heterocyclic ring with the respective phenyl groups.

The X and Y groups can be in any position on the phenyl rings but preferably they are at the 2- or 4-positions, and more preferably at the 4-position, on either or both phenyl rings.

Despite what type of X and Y groups are present in the iodonium cation, the sum of the carbon atoms in the X and Y substituents is from about 6, and preferably from about 8, to about 40. Thus, in some compounds, one or more X groups can comprise from about 6 carbon atoms, and Y does not exist (q is 0). Alternatively, one or more Y groups can comprise from about 6 carbon atoms, and X does not exist (p is 0). Moreover, one or more X groups can comprise less than 6 carbon atoms and one or more Y groups can comprise less than 6 carbon atoms as long as the sum of the carbon atoms in both X and Y is from about 6. Still again, there may be a total of from about 6 carbon atoms on both phenyl rings.

In Structure II, p and q are independently 0 or integers of 1 to 5, provided that either p or q is from about 1. For example, both p and q can be 1. Thus, it is understood that the carbon atoms in the phenyl rings that are not substituted by X or Y groups have a hydrogen atom at those ring positions.

$Z^-$ is an organic borate anion represented by the following Structure (III):

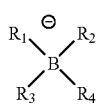

(III)

wherein $R_1$, $R_2$, $R_3$, and $R_4$ are independently substituted or unsubstituted alkyl groups having 1 to 12 carbon atoms (such as methyl, ethyl, n-propyl, iso-propyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazoylyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms.

For example, $R_1$, $R_2$, $R_3$, and $R_4$ are independently substituted or unsubstituted alkyl or aryl groups as defined above, or at least 3 of $R_1$, $R_2$, $R_3$, and $R_4$ are the same or different substituted or unsubstituted aryl groups (such as substituted or unsubstituted phenyl groups). In some embodiments, all of $R_1$, $R_2$, $R_3$, and $R_4$ are the same or different substituted or unsubstituted aryl groups or, all of the groups are the same substituted or unsubstituted phenyl group. For example, $Z^-$ is a tetraphenyl borate wherein the phenyl groups are substituted or unsubstituted.

Representative iodonium borate compounds useful in this invention include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]-borate, 4-methoxyphenyl-4'-cyclohexylphenyliodonium tetrakis (penta-fluorophenyl)borate, 4-methylphenyl-4'-dodecylphenyliodonium tetrakis(4-fluorophenyl)borate, bis(dodecylphenyl)iodonium tetrakis(pentafluorophenyl)-borate, and bis(4-t-butylphenyl)iodonium tetrakis(1-imidazolyl)borate. Useful compounds include bis(4-t-butylphenyl)iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the initiator composition.

The initiator composition including one or more initiator compounds is generally present in the radiation-sensitive composition in an amount of from about 0.5% to about 30%, based on the total solids of the radiation-sensitive composition or the dry weight of the coated imageable layer. For example, the initiator composition is present in an amount of from about 2% to about 20 weight %. In the most embodiments, one or more diaryliodonium borate compounds generally comprise from about 10 to about 100% of the initiator composition.

The IR radiation-sensitive composition sensitivity is provided by the presence of one or more infrared radiation absorbing compounds, chromophores, or sensitizers that absorb imaging radiation, or sensitize the composition to imaging infrared radiation having a $\lambda_{max}$ of from about 700 nm and up to and including 1400 nm, and typically from about 700 to about 1200 nm.

Useful IR radiation absorbing chromophores include various IR-sensitive dyes ("IR dyes"). Examples of suitable IR dyes comprising the desired chromophore include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), U.S. Pat. No. 6,569,603 (noted above), U.S. Pat. No. 6,787,281 (Tao et al.), U.S. Pat. No. 7,135,271 (Kawaushi et al.), and EP 1,182, 033A2 (noted above). Infrared radiation absorbing N-alkylsulfate cyanine dyes are described for example in U.S. Pat. No. 7,018,775 (Tao). A general description of one class of suitable cyanine dyes is shown by the formula in paragraph [0026] of WO 2004/101280 (Munnelly et al.).

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (noted above), U.S. Pat. No. 6,264,920 (Achilefu et al.), U.S. Pat. No. 6,153,356 (noted above), U.S. Pat. No. 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Some useful infrared radiation absorbing dyes have a tetraaryl pentadiene chromophore. Such chromophore generally includes a pentadiene linking group having 5 carbon atoms in the chain, to which are attached two substituted or unsubstituted aryl groups at each end of the linking group. The pentadiene linking group can also be substituted with one or more substituents in place of the hydrogen atoms, or two or more hydrogen atoms can be replaced with atoms to form a ring in the linking group as long as there are alternative carbon-carbon single bonds and carbon-carbon double bonds in the chain.

Such IR-sensitive dyes can be represented by the following Structure DYE-II:

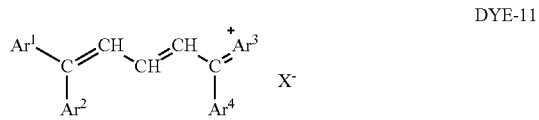

DYE-11 wherein $Ar^1$ through $Ar^4$ are the same or different substituted or unsubstituted aryl groups having at least carbon atoms in the aromatic ring (such as phenyl, naphthyl, and anthryl, or other aromatic fused ring systems) wherein 1 to 3 of the aryl groups are substituted with the same or different tertiary amino group (such as in the 4-position of a phenyl group). Typically two of the aryl groups are substituted with the same or different tertiary amino group, and usually at different ends of the polymethine chain (that is, molecule). For example, $Ar^1$ or $Ar^2$ and $Ar^3$ or $Ar^4$ bear the tertiary amine groups. Representative amino groups include but are not limited to those substituted with substituted or unsubstituted alkyl groups having up to 10 carbon atoms or aryl groups such as dialkylamino groups (such as dimethylamino and diethylamino), diarylamino groups (such as diphenylamino), alkylarylamino groups (such as N-methylanilino), and heterocyclic groups such as pyrrolidino, morpholino, and piperidino groups. The tertiary amino group can form part of a fused ring such that one or more of $Ar^1$ through $Ar^4$ can represent a julolidine group.

Besides the noted tertiary groups noted above, the aryl groups can be substituted with one or more substituted or unsubstituted alkyl groups having 1 to 10 carbon atoms, halo atoms (such as chloro or bromo), hydroxyl groups, thioether groups, and substituted or unsubstituted alkoxy groups having 1 to 10 carbon atoms. Substituents that contribute electron density to the conjugated system are useful. While they are not specifically shown in Structure (DYE-II), substituents or fused rings may also exist on (or as part of) the conjugated chain connecting the aryl groups.

In Structure (DYE-II), $X^-$ is a suitable counterion that may be derived from a strong acid, and include such anions as $ClO_4^-$, $BF_4^-$, $CF_3SO_3^-$, $PF_6^-$, $AsF_6^-$, $SbF_6^-$, and perfluoroethylcyclohexylsulfonate. Other cations include boron-containing anions as described above (borates), methylbenzenesulfonic acid, benzenesulfonic acid, methanesulfonic acid, p-hydroxybenzenesulfonic acid, p-chlorobenzenesulfonic acid, and halides.

Useful infrared radiation absorbing dyes can be obtained from a number of commercial sources including Showa Denko (Japan) or they can be prepared using known starting materials and procedures.

Still other useful infrared radiation absorbing compounds are copolymers can comprise covalently attached ammonium, sulfonium, phosphonium, or iodonium cations and infrared radiation absorbing cyanine anions that have two or four sulfonate or sulfate groups, or infrared radiation absorbing oxonol anions, as described for example in U.S. Pat. No. 7,049,046 (Tao et al.).

The infrared radiation absorbing compounds can be present in the IR-radiation sensitive composition (or imageable layer) in an amount generally of at least 1% and up to and including 30% and typically at least 3 and up to and including 20%, based on total solids in the composition, that also corresponds to the total dry weight of the imageable layer. The particular amount needed for this purpose would be readily apparent to one skilled in the art, depending upon the specific compound used to provide the desired chromophore.

Primary Polymeric Binder

The primary polymeric binder can be chosen to facilitate either off-press or on-press developability of the imaged imageable element.

The primary polymeric binders generally used for on-press developability include polymeric emulsions or dispersions of polymers having pendant poly(alkylene oxide) side chains that are described for example in U.S. Pat. No. 6,582,882 (Pappas et al.), U.S. Pat. No. 6,899,994 (Huang et al.), U.S. Pat. No. 7,005,234 (Hoshi et al.), and U.S. Pat. No. 7,368,215 (Munnelly et al.) and US Patent Application Publication 2005/0003285 (Hayashi et al.) that are all incorporated herein by reference. More specifically, such polymeric binders include but are not limited to, graft copolymers having both hydrophobic and hydrophilic segments, block and graft copolymers having polyethylene oxide (PEO) segments, polymers having both pendant poly(alkylene oxide) segments and cyano groups, and various hydrophilic polymeric binders that may have various hydrophilic groups such as hydroxyl, carboxy, hydroxyethyl, hydroxypropyl, amino, aminoethyl, aminopropyl, carboxymethyl, sulfono, or other groups readily apparent to a worker skilled in the art. In most embodiments, such primary polymeric binders are generally uniformly distributed throughout the radiation-sensitive composition and imageable layer as discrete particles.

The primary polymeric binders generally used for off-press developability include any alkaline solution soluble (or dispersible) polymer having an acid value of from about 20 to about 400 (typically from about 30 to about 200). The following described polymeric binders are particularly useful in the manner but this is not an exhaustive list:

I. Polymers formed by polymerization of a combination or mixture of (a) (meth)acrylonitrile, (b) poly(alkylene oxide) esters of (meth)acrylic acid, and optionally (c) (meth)acrylic acid, (meth)acrylate esters, styrene and its derivatives, and (meth)acrylamide as described for example in U.S. Pat. No. 7,326,521 (Tao et al.) that is incorporated herein by reference. Some particularly useful polymeric binders in this class are derived from one or more (meth)acrylic acids, (meth)acrylate esters, styrene and its derivatives, vinyl carbazoles, and poly(alkylene oxide) (meth)acrylates.

II. Polymers having pendant allyl ester groups as described in U.S. Pat. No. 7,332,253 (Tao et al.) that is incorporated herein by reference. Such polymers may also include pendant cyano groups or have recurring units derived from a variety of other monomers as described in Col. 8, line 31 to Col. 10, line 3 of the noted patent.

III. Polymers having all carbon backbones wherein at least 40 and up to 100 mol % (and typically from about 40 to about 50 mol %) of the carbon atoms forming the all carbon backbones are tertiary carbon atoms, and the remaining carbon atoms in the all carbon backbone being non-tertiary carbon atoms. By "tertiary carbon", we refer to a carbon atom in the all carbon backbone that has three valences filled with radicals or atoms other than a hydrogen atom (which fills the fourth valence). By "non-tertiary carbon", we mean a carbon atom in the all carbon backbone that is a secondary carbon (having two valences filled with hydrogen atoms) or a quaternary carbon (having no hydrogen atoms attached). Typically, most of the non-tertiary carbon atoms are secondary carbon atoms. One way to represent a tertiary carbon atom in the all carbon backbone is with the following Structure (T-CARBON):

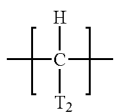

(T-CARBON)

wherein $T_2$ is a group other than hydrogen provided that $T_2$ does not include an ethylenically unsaturated free radically reactive group (such as a —C=C— group). In many embodiments, $T_2$ is a pendant group selected from N-carbazole, aryl (defined similarly as for Ar below), halo, cyano, —C(=O)R, —C(=O)Ar, —C(=O)OR, —C(=O)OAr, —C(=O)NHR, and —C(=O)NHAr pendant groups, wherein R is hydrogen or an alkyl, cycloalkyl, halo, alkoxy, acyl, or acyloxy group, and Ar is an aryl group other than a styryl group. The quaternary carbon atoms present in the all carbon backbone of the polymeric binder can also have the same or different pendant groups filling two of the valences. For example, one or both valences can be filled with the same or different alkyl groups as defined above for R, or one valence can be filled with an alkyl group and another valence can be filled with a N-carbazole, aryl other than a styryl group, halo, cyano, —C(=O)R, —C(=O)Ar, —C(=O)OR, —C(=O)OAr, —C(=O)NHR, or —C(=O)NHAr pendant group, wherein R and Ar are as defined above. The pendant groups attached to the tertiary and quaternary carbons in the all carbon backbone can be the same or different and typically, they are different. It should also be understood that the pendant groups attached to the various tertiary carbon atoms can be the same throughout the polymeric molecule, or they can be different. For example, the tertiary carbon atoms can be derived from the same or different ethylenically unsaturated polymerizable monomers. Moreover, the quaternary carbon atoms throughout the polymeric molecule can have the same or different pendant groups.

In some embodiments of this invention, the primary polymeric binder can be represented by the following Structure:

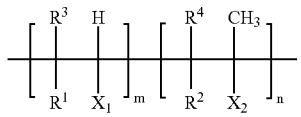

wherein m is at least 85 mol % and the sum of m and n is 100 mol %. In some embodiments, m is at least 89 mol %, and in other embodiments, m is from about 85 to 100 mol %. In this Structure, $R^1$ through $R^4$ are independently hydrogen or alkyl, cycloalkyl, aryl (other than styryl), halo, alkoxy, acyl, or acyloxy groups as defined above, and $X_1$ and $X_2$ are independently N-carbazole, aryl (other than styryl), halo, cyano, —C(=O)R, —C(=O)Ar, —C(=O)OR, —C(=O)OAr, —C(=O)NHR, or —C(=O)NHAr groups wherein R and Ar is as defined above. Alternatively, $R^1$ and $X_1$ together or $R^2$ and $X_2$ together can form a substituted or unsubstituted carbocyclic or heterocyclic ring. When either $R^2$ or $R^4$ is hydrogen, both are then hydrogen. For example, $R^1$ through $R^4$ can be independently hydrogen, methyl, or halo groups, and more likely, each is hydrogen. In addition, $X_1$ can be one or more of acetyl, phenyl (other than a styryl group), N-carbazole, cyano, carboxy ester, or carboxy amide pendant groups, and $X_2$ can be one or more carboxy ester or carboxy amide pendant groups.

Representative recurring units comprising tertiary carbon atoms can be derived from one or more ethylenically unsaturated polymerizable monomers selected from vinyl carbazole, styrene and derivatives thereof (other than divinylbenzene and similar monomers that provide pendant carbon-carbon polymerizable groups), acrylic acid, acrylonitrile, acrylamides, acrylates, and methyl vinyl ketone. As noted above, two or more different recurring units can be used. Similarly, representative recurring units with secondary or quaternary carbon atoms can be derived from one or more ethylenically unsaturated polymerizable monomers selected from methacrylic acid, methacrylates, methacrylamides, and α-methylstyrene.

IV. Polymeric binders that have one or more ethylenically unsaturated pendant groups (reactive vinyl groups) attached to the polymer backbone. Such reactive groups are capable of undergoing polymerizable or crosslinking in the presence of free radicals. The pendant groups can be directly attached to the polymer backbone with a carbon-carbon direct bond, or through a linking group ("X") that is not particularly limited. The reactive vinyl groups may be substituted with at least one halogen atom, carboxy group, nitro group, cyano group, amide group, or alkyl, aryl, alkoxy, or aryloxy group, and particularly one or more alkyl groups. In some embodiments, the reactive vinyl group is attached to the polymer backbone through a phenylene group as described, for example, in U.S. Pat. No. 6,569,603 (Furukawa et al.) that is incorporated herein by reference. Other useful polymeric binders have vinyl groups in pendant groups that are described, for example in EP 1,182,033A1 (Fujimaki et al.) and U.S. Pat. No. 4,874,686 (Urabe et al.), U.S. Pat. No. 7,729,255 (Tao et al.), U.S. Pat. No. 6,916,595 (Fujimaki et al.), and U.S. Pat. No. 7,041,416 (Wakata et al.) that are incorporated by reference, especially with respect to the general formulae (1) through (3) noted in EP 1,182,033A1.

For example, the reactive vinyl group can be represented by the structure: —X—CR$^1$=C(R$^2$)R$^3$ wherein X, $R^1$, $R^2$, and $R^3$ are defined below.

Such primary polymeric binders can be represented by the following Structure (I):

wherein A represents recurring units comprising one or more pendant reactive vinyl groups that are directly or indirectly attached to the hydrophobic polymeric backbone, A' represents recurring units other than those represented by A, w is from about 1 to about 70 mol %, and w' is from about 30 to about 99 mol %. Thus, the A' recurring units contain no pendant reactive vinyl groups.

For example, the reactive vinyl groups can be connected to the polymer backbone with a carbon-carbon direct bond or a linking group. For example, useful reactive vinyl groups are shown in Structure IIa and IIb below as Z' groups. The X linking groups may be an oxy (—O—), thio (—S—), carbonyloxy [—C(O)O—], carbonamido [—C(O)NR'—], carbonyl [—C(O)—], amido (—NR'—), sulfonyl [—S(=O)$_2$O—], substituted or unsubstituted arylene group (such as a substituted or unsubstituted phenylene group), or a substituted or unsubstituted alkylene group (having 1 to 10 carbon atoms, such as a methylene group), or combinations of two or more of these groups. In particular, X may be an oxy, thio, —NR'—, or substituted or unsubstituted arylene group having 6 to 10 carbon atoms in the ring (such as substituted or unsubstituted phenylene). R' can be hydrogen, a substituted or unsubstituted alkyl group having 1 to 6 carbon atoms, or a substituted or unsubstituted aryl group having 6 or 10 carbon atoms in the ring. In many embodiments, X is a direct bond or a carbonyloxymetheylene or a methyleneoxyphenylene group.

Z' is represented by the following Structure (IIa) or (IIb):

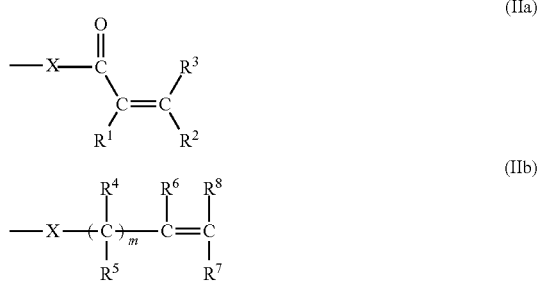

wherein X is defined as above.

$R^1$ to $R^8$ independently represent monovalent organic groups of which there are hundreds of possibilities including but not limited to, hydrogen, substituted or unsubstituted alkyl groups having 1 to 10 carbon atoms, substituted or unsubstituted cycloalkyl groups having 5 to 10 carbon atoms in the unsaturated ring, substituted or unsubstituted aryl groups having 6 to 10 carbon atoms in the aromatic ring, substituted or unsubstituted heterocyclyl groups having 5 to 10 carbon, nitrogen, sulfur, or oxygen atoms in the aromatic or non-aromatic rings, cyano, halo, and vinyl groups.

When the pendant groups comprise the moiety represented by Structure IIb, $R^4$ and $R^5$ can be independently hydrogen or a substituted or unsubstituted alkyl group having 1 to 3 carbon atoms, and $R^6$ to $R^8$ can be independently hydrogen, or a halo group, substituted or unsubstituted alkyl group having 1 to 6 carbon atoms, or a substituted or unsubstituted phenyl group. For example, $R^6$ to $R^8$ can be independently hydrogen or a chloro, methyl, ethyl, or phenyl groups.

In Structure IIb, m is 0 or 1, and preferably it is 1.

For example, Z' can be represented by the following Structure IIc:

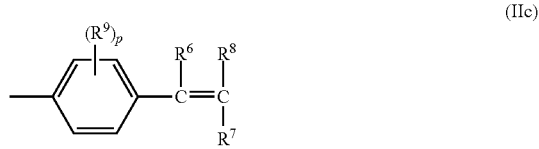

wherein $R^6$ through $R^8$ are as defined above, $R^9$ is a substitutable group or atom that would be readily apparent to one skilled in the art, and p is an integer of 0 to 4. Most preferably, p is 0, and $R^6$ through $R^8$ are all hydrogens.

Some useful pendant reactive vinyl groups are alkenyl groups including but not limited to allyl esters, styryl, and (meth)acryloyl groups. For example, such groups can be provided by allyl(meth)acrylates, or by reacting a polymer precursor with an allyl halide, 4-vinylbenzyl chloride, or (meth) acryloyl chloride using conditions that would be apparent to a skilled worker in the art.

The A' recurring units can be derived from one or more of the polymerizable ethylenically unsaturated monomers that are described below for the B, C, and D recurring units. Generally, recurring units from at least one monomer from each of the B, C, and D groups are present in the desired molar amounts described below.

In some embodiments, the primary polymeric binder can be represented by the following Structure (IA):

wherein A represents recurring units comprising a pendant allyl(meth)acrylate group that is directly or indirectly attached to the hydrophobic polymer backbone, B represents recurring units comprising pendant cyano groups, C represents recurring units comprising pendant acidic groups, D represents recurring units other than those represented by A, B, and C, w is from about 1 to about 70 mol %, x is from about 10 to about 80 mol %, y is from about 1 to about 30 mol %, and z is from 0 to about 90 mol %, The B recurring units are generally derived from one or more of (meth)acrylonitrile, cyanostyrenes, or cyano(meth) acrylates.

The C recurring units comprise one or more acidic groups such as carboxy, phosphoric acid, and sulfonic acid, as well as salts thereof (carboxylates, sulfonates, etc.). Monomers from such recurring units can be derived include but are not limited to, carboxy-containing vinyl monomers, carboxylated styrenes, and sulfated styrenes. Ethylenically unsaturated polymerizable monomers that have carboxy groups, or that have reactive groups that can be converted to carboxy groups, or to which carboxy groups can be attached after polymerization, are particularly useful. Thus, the carboxy groups can be obtained from a number of synthetic methods. Useful monomers having pendant carboxylic acid groups include but are not limited to, (meth)acrylic acid, 4-carboxyphenyl(meth) acrylate, and 4-carboxystyrene.

The D recurring units are derived from one or more of vinyl carbazole or vinyl carbazole derivatives as described in U.S. Pat. No. 7,175,949 (Tao et al.), alkyl(meth)acrylates [such as methyl(meth)acrylates], (meth)acrylamides, N-phenyl maleimides, poly(alkylene glycol)methyl ether(meth)acrylates [such as poly(ethylene glycol)methyl ether(meth)acrylates], and styrene monomers such as substituted and unsubstituted styrene. Useful combinations of D recurring units include a combination of recurring units derived from two or more of a methyl(meth)acrylate, an N-vinyl carbazole, and a polyethylene glycol methyl ether(meth)acrylate. These are merely provided as examples and not intended to be limiting since a skilled artisan could use many other ethylenically unsaturated polymerizable monomers.

V. Polymeric binders can have pendant 1H-tetrazole groups as described in U.S. Ser. No. 11/949,810 (Baumann et al.) that is incorporated herein by reference.

VI. Still other useful polymeric binders may be homogenous, that is, dissolved in the coating solvent, or may exist as discrete particles and include but are not limited to, (meth) acrylic acid and acid ester resins [such as (meth)acrylates], polyvinyl acetals, phenolic resins, polymers derived from styrene, N-substituted cyclic imides or maleic anhydrides, such as those described in EP 1,182,033 (noted above) and U.S. Pat. No. 6,309,792 (Hauck et al.), U.S. Pat. No. 6,352,812 (Shimazu et al.), U.S. Pat. No. 6,569,603 (noted above), and U.S. Pat. No. 6,893,797 (Munnelly et al.). Also useful are the vinyl carbazole polymers described in U.S. Pat. No. 7,175,949 (Tao et al.). Copolymers of polyethylene glycol methacrylate/acrylonitrile/styrene in particulate form, dissolved copolymers derived from carboxyphenyl methacrylamide/acrylonitrile/-methacrylamide/N-phenyl maleimide, copolymers derived from polyethylene glycol methacrylate/acrylonitrile/vinyl carbazole/styrene/methacrylic acid, copolymers derived from N-phenyl maleimide/methacrylamide/methacrylic acid, copolymers derived from urethane-acrylic intermediate A (the reaction product of p-toluene sulfonyl isocyanate and hydroxyl ethyl methacrylate)/acrylonitrile/N-phenyl maleimide, and copolymers derived from N-methoxymethyl methacrylamide/methacrylic acid/acrylonitrile/n-phenyl maleimide are useful.

Other useful primary polymeric binders are particulate poly(urethane-acrylic) hybrids that are distributed (usually uniformly) throughout the imageable layer. Each of these hybrids has a molecular weight of from about 50,000 to about 500,000 and the particles have an average particle size of from about 10 to about 10,000 nm (typically from about 30 to about 500 nm). These hybrids can be either "aromatic" or "aliphatic" in nature depending upon the specific reactants used in their manufacture. Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles.

Secondary Polymeric Binder

The secondary polymeric binders useful in this invention are poly(vinyl acetate)s, each of which has a degree of hydrolysis of less than 60 mol %, and typically at least 10 and less than 60 mol %, or at least 30 and up to 60 mol %.

For example, the secondary polymeric binders can be represented by the following Structure (PVAc):

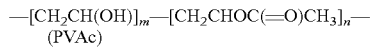
(PVAc)

wherein m is less than 60 mol % and m+n=100%.

Such polymers can be obtained from a number of commercial sources, or prepared using known starting materials and procedures. The secondary polymeric binders generally have an average molecular weight ($M_w$) of from about 5,000 to about 500,000 and typically from about 10,000 to about 400,000 or from about 15,000 to about 250,000. Representative secondary polymeric binders are as follows:

Gohsefimer LL02, a poly(vinyl acetate) with a hydrolysis degree of 45.0-51.0 mol %, commercially available from Nippon Gohsei (Japan).

Gohsefimer L5407, a poly(vinyl acetate) with a hydrolysis degree of 34.0-38.0 mol %, commercially available from Nippon Gohsei.

Gohsefimer L7514, a poly(vinyl acetate) with a hydrolysis degree of 34.0-38.0 mol %, commercially available from Nippon Gohsei.

Kuraray POVAL® LM-10HD, a poly(vinyl acetate) with a hydrolysis degree of 38.0-42.0 mol %, commercially available from KURARAY AMERICA INC.

ALCOTEX 552P, a poly(vinyl acetate) with a hydrolysis degree of 54.0-57.0 mol %, commercially available from SYNTHOMER Limited (UK).

ALCOTEX WD200, a poly(vinyl acetate) with a hydrolysis degree of 42.0-45.0 mol %, commercially available from SYNTHOMER Limited.

POLYVIOL® W45/450, a poly(vinyl acetate) with a hydrolysis degree of 42.0-50.0 mol %, commercially available from WACKER Chemie AG (Germany).

The primary polymeric binder is generally present in the radiation-sensitive composition (and imageable layer) in an amount of at least 5 and up to 70 weight %, and typically from about 10 to about 50 weight % based on the total solids in the composition and layer. The amount may be varied depending upon whether the imageable element is designed for off-press or on-press developability.

The secondary polymeric binder is generally present in an amount of at least 1 and up to 80 weight %, and typically from about 1 to about 40 weight % or from about 5 to about 30 weight %, based on the total solids in the composition or layer.

The radiation-sensitive composition (and imageable layer) can also include a variety of optional compounds including but not limited to, dispersing agents, humectants, biocides, plasticizers, surfactants for coatability or other properties, viscosity builders, contrast dyes or colorants to allow visualization of the written image (such as crystal violet, methyl violet, ethyl violet, Victoria Blue B, Victoria Blue R, malachite green, and brilliant green), pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

Imageable Elements

The imageable elements can be formed by suitable application of an infrared radiation-sensitive composition as described above to a suitable substrate to form an imageable layer. This substrate can be treated or coated in various ways as described below prior to application of the radiation-sensitive composition to improve hydrophilicity. Typically, there is only a single imageable layer comprising the radiation-sensitive composition that is directly applied to the substrate without any intermediate layer.

The element does not include what is conventionally known as an overcoat (also known as an "oxygen impermeable topcoat" or "oxygen barrier layer") disposed over the imageable layer, for example, as described in EP Patent Publications 1,788,429, 1,788,431 and 1,788,434 (all noted above) and US Patent Application Publication 2005/0266349 (noted above). Thus, the imageable layer is the outermost layer of the imageable element.

The substrate generally has a hydrophilic surface, or at least a surface that is more hydrophilic than the applied imageable layer on the imaging side. The substrate comprises a support that can be composed of any material that is conventionally used to prepare imageable elements such as lithographic printing plates. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

One useful substrate is composed of an aluminum support that may be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful hydrophilic lithographic substrate is an electrochemically grained and sulfuric acid-anodized aluminum support that provides a hydrophilic surface for lithographic printing.

Sulfuric acid anodization of the aluminum support generally provides an oxide weight (coverage) on the surface of from about 1.5 to about 5 g/m$^2$ and more typically from about 3 to about 4.3 g/m$^2$. Phosphoric acid anodization generally provides an oxide weight on the surface of from about 1.5 to about 5 g/m$^2$ and more typically from about 1 to about 3 g/m$^2$. When sulfuric acid is used for anodization, higher oxide weight (at least 3 g/m$^2$) may provide longer press life.

The aluminum support may also be treated with, for example, a silicate, dextrine, calcium zirconium fluoride, hexafluorosilicic acid, poly(vinyl phosphonic acid) (PVPA), vinyl phosphonic acid copolymer, poly[(meth)acrylic acid], or acrylic acid copolymer to increase hydrophilicity. Still further, the aluminum support may be treated with a phosphate solution that may further contain an inorganic fluoride (PF). The aluminum substrate can be electrochemically-grained, sulfuric acid-anodized, and treated with PVPA or PF using known procedures.

The thickness of the substrate can be varied but should be sufficient to sustain the wear from printing and thin enough to wrap around a printing form. Useful embodiments include a treated aluminum foil having a thickness of at least 100 μm and up to and including 700 μm.

The backside (non-imaging side) of the substrate may be coated with antistatic agents and/or slipping layers or a matte layer to improve handling and "feel" of the imageable element.

The substrate can also be a cylindrical surface having the imageable layer thereon, and thus be an integral part of the printing press. The use of such imaging cylinders is described for example in U.S. Pat. No. 5,713,287 (Gelbart).

An infrared radiation-sensitive composition containing the components described above can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder).

Illustrative of such manufacturing methods is mixing the free radically polymerizable component, initiator composition, polymeric binder, IR radiation absorbing compound, primary polymeric binder, secondary polymeric binder comprising a poly(vinyl acetate) with a degree of hydrolysis of less than 60 mol %, and any other components of the infrared radiation-sensitive composition in a suitable coating solvent including water, organic solvents [such as glycol ethers including 1-methoxypropan-2-ol, methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], or mixtures thereof, applying the resulting solution to a substrate, and removing the solvent(s) by evaporation under suitable drying conditions. Some representative coating solvents (mixtures) and imageable layer formulations are described in the Invention Examples below. After proper drying, the coating weight of the imageable layer is generally at least 0.1 and up to and including 5 g/m$^2$ or at least 0.5 and up to and including 3.5 g/m$^2$.

Imaging Conditions

During use, the imageable element is exposed to a suitable source of infrared or near-infrared imaging or exposing radiation depending upon the infrared radiation absorbing compound present in the radiation-sensitive composition, at a wavelength of from about 700 to about 1500 nm. For example, imaging can be carried out using imaging or exposing radiation, such as from an infrared laser (or array of lasers) at a wavelength of at least 750 nm and up to and including about 1400 nm and typically at least 700 nm and up to and including 1200 nm. Imaging can be carried out using imaging radiation at multiple wavelengths at the same time if desired.

The laser used to expose the imageable element is usually a diode laser (or array of lasers), because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of at least 800 nm and up to and including 850 nm or at least 1060 and up to and including 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imageable member mounted to the interior or exterior cylindrical surface of the drum. An example of an useful imaging apparatus is available as models of Kodak Trendsetter platesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging with infrared radiation can be carried out generally at imaging energies of at least 30 mJ/cm$^2$ and up to and including 500 mJ/cm$^2$, and typically at least 50 and up to and including 300 mJ/cm$^2$ depending upon the sensitivity of the imageable layer.

Development and Printing

After thermal imaging, the elements are processed either "off-press" using an alkaline processing solution described herein, or on-press as described below. Processing is carried out for a time sufficient to remove predominantly only the non-exposed regions of the outermost imaged imageable layer to reveal the hydrophilic surface of the substrate, but not long enough to remove significant amounts of the exposed regions. The revealed hydrophilic surface repels inks while the exposed regions accept ink. Thus, the non-exposed regions to be removed are "soluble" or "removable" in the processing solution because they are removed, dissolved, or dispersed within it more readily than the regions that are to remain. The term "soluble" also means "dispersible".

Thus, without the need for a pre-heat step after imaging, the imaged elements can be developed "off-press" using conventional processing and a conventional developer such as an organic solvent-based developer. Development can be accomplished using what is known as "manual" development, "dip" development, or processing with an automatic development apparatus (processor).

In the case of "manual" development, development is conducted by rubbing the entire imaged element with a sponge or cotton pad sufficiently impregnated with a suitable developer (described below), and followed by rinsing with water. "Dip" development involves dipping the imaged element in a tank or tray containing the appropriate developer for about 10 to about 60 seconds (especially from about 20 to about 40 seconds) under agitation, followed by rinsing with water with or without rubbing with a sponge or cotton pad. The use of automatic development apparatus is well known and generally includes pumping a developer into a developing tank or ejecting it from spray nozzles. The imaged element is contacted with the developer in an appropriate manner. The apparatus may also include a suitable rubbing mechanism (for example a brush or roller) and a suitable number of conveyance rollers. Some developing apparatus include laser exposure means and the apparatus is divided into an imaging section and a developing section.

Developers or processing solutions commonly include surfactants, chelating agents (such as salts of ethylenediaminetetraacetic acid), organic solvents (such as benzyl alcohol), and alkaline components (such as inorganic metasilicates, organic metasilicates, hydroxides, and bicarbonates). The pH of the developer is generally greater than 7 and up to 14. The imaged elements are generally developed using conventional processing conditions. Both aqueous alkaline developers and organic solvent-containing developers can be used with the latter type of developers being preferred.

Useful alkaline aqueous developers include 3000 Developer, 9000 Developer, GOLDSTAR Developer, GREENSTAR Developer, ThermalPro Developer, PROTHERM Developer, MX1813 Developer, and MX1710 Developer (all available from Eastman Kodak Company). These compositions also generally include surfactants, chelating agents (such as salts of ethylenediaminetetraacetic acid), and alkaline components (such as inorganic metasilicates, organic metasilicates, hydroxides, and bicarbonates).

Organic solvent-containing developers are generally single-phase solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 and up to 15% based on total developer weight. The organic solvent-containing developers can be neutral, alkaline, or slightly acidic in pH, and preferably, they are alkaline in pH.

Representative solvent-based developers include ND-1 Developer, Developer 980, 2 in 1 Developer, 955 Developer, D29 Developer (described below), and 956 Developer (all available from Eastman Kodak Company).

In some instances, a single processing solution is used to both develop the imaged element by removing predominantly the non-exposed regions and also to provide a protective layer or coating over the entire imaged and developed surface. In this aspect, the processing solution can behave somewhat like a gum that is capable of protecting the lithographic image on the printing plate against contamination or damage (for example, from oxidation, fingerprints, dust, or scratches). Such processing solutions are described for example in copending and commonly assigned U.S. Ser. No. 12/104,544 (filed Apr. 177, 2008 by K. Ray, Yu, and Saraiya) that is incorporated herein by reference. Such processing solutions generally have a pH greater than 2 and up to about 11, and typically from about 6 to about 11, or from about 6 to about 10.5, as adjusted using a suitable amount of an acid or base. They generally include one or more anionic surfactants, even though optional components (such as nonionic surfactants) can be present if desired. Useful anionic surfactants include those with carboxylic acid, sulfonic acid, or phosphonic acid groups (or salts thereof). Anionic surfactants having sulfonic acid (or salts thereof) groups are particularly useful. For example, such anionic surfactants can include aliphates, abietates, hydroxyalkanesulfonates, alkanesulfonates, dialkylsulfosuccinates, alkyldiphenyloxide disulfonates, straight-chain alkylbenzenesulfonates, branched alkylbenzenesulfonates, alkylnaphthalenesulfonates, alkylphenoxypolyoxy-ethylenepropylsulfonates, salts of polyoxyethylene alkylsulfonophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylester, salts of alkylsulfuric esters, sulfuric esters of polyoxy-ethylene alkylethers, salts of sulfuric esters of aliphatic monoglucerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrene-maleic anhydride copolymers, partially saponified compounds of olefin-maleic anhydride copolymers, and naphthalenesulfonateformalin condensates. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary anionic surfactant. Such surfactants can be obtained from various suppliers as described in McCutcheon's Emulsifiers & Detergents, 2007 Edition.

The one or more anionic surfactants can be generally present in an amount of at least 1 weight %, and typically from about 5 weight % or from about 8 weight % and up to about 45 weight %, or up to about 30 weight % (% solids). In some embodiments, the one or more anionic surfactants can be present in an amount of from about 8 to about 20 weight %.

The processing solution (or developer) can be applied to the imaged element by rubbing, spraying, jetting, dipping, immersing, slot die coating (for example see FIGS. 1 and 2 of U.S. Pat. No. 6,478,483 of Maruyama et al.) or reverse roll coating (as described in FIG. 4 of U.S. Pat. No. 5,887,214 of Kurui et al.), or by wiping the outer layer with the processing solution or contacting it with a roller, impregnated pad, or applicator containing the gum. For example, the imaged element can be brushed with the processing solution, or it can be poured onto or applied by spraying the imaged surface with sufficient force to remove the non-exposed regions using a spray nozzle system as described for example in [0124] of EP 1,788,431A2 (noted above) and U.S. Pat. No. 6,992,688 (Shimazu et al.). Still again, the imaged element can be immersed in the processing solution and rubbed by hand or with an apparatus.

The processing solution can also be applied in a processing unit (or station) in a suitable apparatus that has at least one roller for rubbing or brushing the imaged element while the processing solution is applied. By using such a processing unit, the non-exposed regions of the imaged layer may be removed from the substrate more completely and quickly. Residual processing solution may be removed (for example, using a squeegee or nip rollers) or left on the resulting printing plate without any rinsing step. Excess processing solution can be collected in a tank and used several times, and replenished if necessary from a reservoir. The processing solution replenisher can be of the same concentration as that used in processing, or be provided in concentrated form and diluted with water at an appropriate time.

Following processing, the resulting lithographic printing plate can be used for printing with or without a separate rinsing step using water.

The resulting lithographic printing plate can also be baked in a postbake operation can be carried out, with or without a blanket or floodwise exposure to UV or visible radiation using known conditions. Alternatively, a blanket UV or visible radiation exposure can be carried out, without a postbake operation.

Printing can be carried out by applying a lithographic printing ink and fountain solution to the printing surface of the imaged and developed element. The fountain solution is taken up by the non-imaged regions, that is, the surface of the hydrophilic substrate revealed by the imaging and processing steps, and the ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

Some imageable elements of this invention are developable "on-press". This type of development avoids the use of the developing solutions described above and the use of a separate development apparatus. The imaged element is directly mounted onto the press wherein the non-exposed regions in the imageable layer are removed by a suitable fountain solution, lithographic ink, or both, in any order, during printing. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+ Varn PAR (alcohol sub) (available from Varn International, Addison, Ill.). Alternatively, the imageable element can be both imaged and developed on-press.

The following examples are provided to illustrate the practice of the invention but are by no means intended to limit the invention in any manner.

EXAMPLES

The components and materials used in the examples and analytical methods used in evaluation were as follows. Unless otherwise indicated, the components can be obtained from Aldrich Chemical Company (Milwaukee, Wis.):

ALCOTEX 552P is a poly(vinyl acetate) with a hydrolysis degree of 54.0-57.0 mol %, commercially available from SYNTHOMER Limited (UK).

Byk® 307 is a polyethoxylated dimethyl polysiloxane copolymer that was obtained from Byk Chemie (Wallingford, Conn.) in a 10 wt. % PGME solution.

Byk® 336 was obtained from Byk Chemie (Wallingford, Conn.) in a 25 wt. % xylene/methoxypropyl acetate solution.

Blue 63 is a 3-(4-diethylamino-2-ethoxyphenyl)-3-(1-ethyl-2-methylindol-3-yl)-4-azaphthalide that was obtained from Yamamoto Chemicals, Inc. (Japan).

Graft polymer A is a polymer dispersion containing 20 wt % styrene, 70 wt % acrylonitrile, and 10 wt % polyethylene glycol methyl ether methacrylate; 24% in propanol/water (80/20).

IR Dye A is a cyanine dye with the following structure:

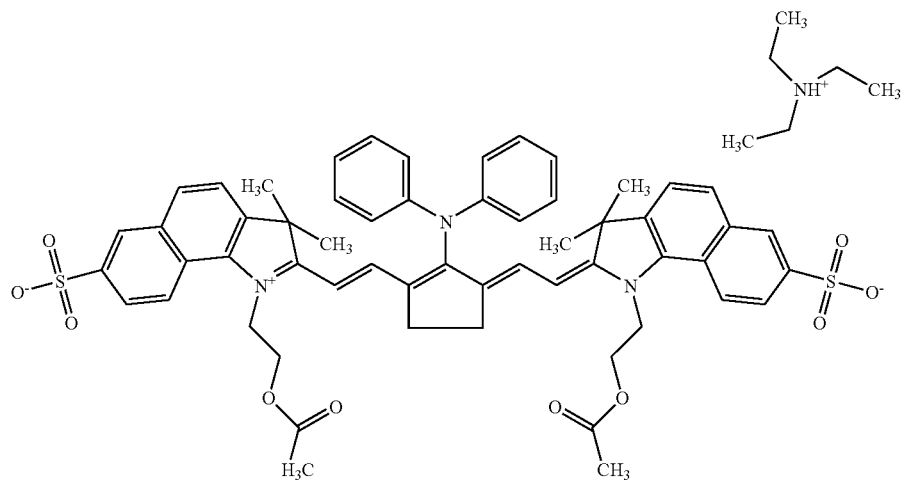

IR Dye B is a cyanine dye with the following structure:

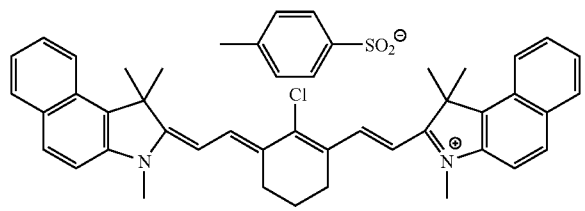

IRT is an IR Dye that was obtained from Showa Denko (Japan).

Initiator A is bis(4-t-butylphenyl)iodonium tetraphenylborate.

Irgacure® 250 is a 75 wt. % solution of iodonium, (4-methoxyphenyl)[4-(2-methylpropyl)phenyl]-, hexafluorophosphate in propylene carbonate that was obtained from Ciba Specialty Chemicals (Tarrytown, N.Y.).

LL02 is a poly(vinyl acetate) with a hydrolysis degree of 45.0-51.0 mol % that was obtained from Nippon Gohsei (Japan).

MEK represents methyl ethyl ketone.

Monomer A is a reaction product from 0.1 mol of hexamethylene diisocyanate and 0.2 mol of hydroxyethyl methacrylate in 6 g of MEK.

Oligomer A is a urethane acrylate prepared by reacting DESMODUR N100 (an aliphatic polyisocyanate resin based on hexamethylene diisocyanate from Bayer Corp., Milford, Conn.) with hydroxyethyl acrylate and pentaerythritol triacrylate (80% wt solution in 2-butanone).

PGME represents 1-methoxy-2-propanol.

PEGDA is a poly(ethylene glycol) diacid (Mw=600).

Pigment A (951) is a 27% solids dispersion of 7.7 parts of a polyvinyl acetal derived from poly(vinyl alcohol) acetalized with acetaldehyde, butyraldehyde, and 4-formylbenzoic acid, 76.9 parts of Irgalith Blue GLVO (Cu-phthalocyanine C.I. Pigment Blue 15:4) and 15.4 parts of Disperbyk® 167 dispersant (Byk Chemie) in 1-methoxy-2-propanol.

Kuraray POVAL® LM-10HD is a poly(vinyl acetate) with a hydrolysis degree of 38.0-42.0 mol % that was obtained from KURARAY AMERICA INC.

SR-399 is dipentaerythritol pentaacrylate that was obtained from Sartomer Company, Inc. (Exton, Pa.).

SR-494 is ethoxylated pentaerythritol tetraacrylate from Sartomer Company, Inc.

Sipomer PAM-100 is an ethylene glycol methacrylate phosphate with 4-5 ethylene glycol units that was obtained from Rhodia (France).

TBMPS represents tribromomethyl phenyl sulphone.

TMSPMA represents 3-trimethoxysilylpropyl methacrylate. 955 Developer is a benzyl alcohol-containing alkaline negative developer (Eastman Kodak Company).

Synthetic Preparation of Polymer A:

AIBN [2,2'-azobis(iso-butyronitrile), Vazo-64, 1.6 g], methyl methacrylate (12 g), acrylonitrile (25 g), N-vinyl carbazole (18 g, from Polymer Dajac), methacrylic acid (25 g), and DMAC (320 g) were placed in a 1000-ml 3-necked flask, equipped with magnetic stirring, temperature controller, and $N_2$ inlet. The reaction mixture was heated to 75° C. and stirred under $N_2$ protection overnight (about 16 hours). The % N.V. was measured with about 20%.

To above reaction mixture (after nitrogen protection was removed), potassium hydroxide (11.8 g) in water (40 g) was slowly added and a viscous liquid was formed. After stirring the mixture for 20 minutes, allyl bromide (25.5 g) was added and the mixture was stirred at 55° C. for 3 hours. Concentrated (36%) hydrochloric acid (23 g) in DMAC (50 g) was added to the flask and the reaction mixture was stirred for another 3 hours. The resulting reaction mixture was then slowly dropped into a mixture of 12 liters of ice water with 20 g of concentrated hydrochloric acid while stirring. The resulting precipitate was filtered and washed with 2000 ml of propanol, followed by washing with 3000 ml of water. A fine white powder was obtained after filtration. The powder was dried at room temperature overnight and then at 50° C. for 3 hours to obtain 81 g of polymer solid.

Invention Example 1

The imageable layer coating composition A shown in TABLE I below was prepared to give a 5.6% w/w solution in a solvent mixture of 40% n-propanol, 25% PGME, 30% MEK, and 5% water. The resulting solution was applied to an electrochemically grained, sulfuric acid-anodized, aluminum-containing substrate that had been treated with a poly (vinyl phosphonic acid) (PVPA), using a slot coater at 2.5 $cm^3/ft^2$ (26.9 $cm^3/m^2$) and dried to give a dry imageable layer coverage of 0.93 $g/m^2$. The coating drum temperature was 180° F. (82.2° C.) and the duration was 80 seconds. After cooling to room temperature, an imageable element (lithographic printing plate precursor) was obtained.

Samples of the imageable element were treated under various conditions in order to accelerate the effects of ageing. In one test, the elements were wrapped in interleaving and foil and then treated for 5 days at 48° C. (dry aging test). In another case, elements were hung in a humidity chamber for 5 days at 38° C. and 80% relative humidity (humidity aging test). In yet another test, the elements were placed at room temperature in dark (inside a cardboard box) for 5-10 days (natural aging test).

After various aging conditions (natural, dry and humidity aging), all of the elements were exposed from 50 to 125 $mJ/cm^2$ on a Kodak® Trendsetter 3244x image setter. The imaged elements were then directly mounted on an ABDick duplicator press charged with Van Son rubber-based black ink. The fountain solution was Varn 142W etch at 3 oz per gallon (23.4 ml/l) and PAR alcohol replacement at 3 oz per gallon (23.4 ml/l). The press was run for 200 impressions. Development of the resulting lithographic printing plates was assessed from the 200th sheets by visual evaluation (see TABLE II for development results).

In a press run length test, each imageable element was subsequently exposed at 150 $mJ/cm^2$ at 15 watts on a Kodak® Trendsetter 3244x image setter and was used to provide 29,000 good impressions on a Miehle press with a wear ink containing 1.5% calcium carbonate.

TABLE I

| Components | % of Components in Solids (by weight) | | | | | |
| --- | --- | --- | --- | --- | --- | --- |
| | Composition A | Composition B | Composition C | Composition D | Composition E | Composition F |
| SR-494 | 11.0 | 10.1 | 10.1 | 12.2 | — | — |
| Graft polymer A | 38.0 | 37.9 | 37.9 | 42.2 | 34.0 | 38.0 |
| Initiator A | 5.5 | 5.1 | 5.1 | 6.1 | 6.0 | 6.0 |
| Irgacure ® 250 | 3.0 | 2.8 | 2.8 | 3.3 | — | — |

TABLE I-continued

| | % of Components in Solids (by weight) | | | | | |
|---|---|---|---|---|---|---|
| Components | Composition A | Composition B | Composition C | Composition D | Composition E | Composition F |
| IR Dye A | 4.0 | 3.7 | 3.7 | 4.5 | — | — |
| IRT | — | — | — | — | 3.0 | 3.0 |
| Byk ® 336 | 2.3 | 2.1 | 2.1 | 2.5 | — | — |
| Byk ® 307 | — | — | — | — | 1.0 | 1.0 |
| Sipomer PAM-100 | 1.5 | 1.4 | 1.4 | 1.7 | 2.0 | 2.0 |
| TMSPMA | — | — | — | — | 2.0 | 2.0 |
| SR-399 | 14.7 | 13.6 | 13.6 | 16.4 | 27.0 | 28.0 |
| Blue-63 | 4.0 | 3.7 | 3.7 | 4.5 | — | — |
| Pigment A | — | — | — | — | 3.0 | 3.0 |
| Polymer A | — | — | — | — | 17.0 | 17.0 |
| LL02 | 10.0 | — | — | — | 5.0 | — |
| Kuraray POVAL ® LM-10HD | — | 14.2 | — | — | — | — |
| ALCOTEX 552P | — | — | 14.2 | — | — | — |
| PEGDA | 6.0 | 5.5 | 5.5 | 6.7 | — | — |

TABLE II

| | Shelf life Evaluation | | |
|---|---|---|---|
| Imageable Element | Natural aging | Dry aging | Humidity aging |
| Invention Example 1 | 1 | 1 | 1 |
| Invention Example 2 | 1 | 1 | 1 |
| Invention Example 3 | 1 | 1 | 1 |
| Invention Example 4 | 1 | 1 | 1 |
| Invention Example 5 | 1 | 1 | 1 |
| Comparative Example 1 | 1 | 2-3 | 2-3 |
| Comparative Example 3 | 1 | 1 | 2 |

1: good quality image at 100 mJ/cm², clean background.
2: clear differentiation between exposed and non-exposed areas, not complete clean in background.
3: no differentiation between exposed and non-exposed areas, both having ink heavily.

Invention Example 2

The imageable layer coating composition A shown in TABLE I above was prepared to give a 5.6% w/w solution in a solvent mixture of 40% n-propanol, 25% PGME, 30% MEK, and 5% water. The resulting solution was applied to an electrochemically grained, sulfuric acid-anodized, aluminum-containing substrate that had been treated with a sodium phosphate fluoride (PF), using a slot coater at 2.5 cm³/ft² (26.9 cm³/m²) and dried to give a dry imageable layer coverage of 0.93 g/m². The coating drum temperature was 180° F. (82.2° C.) and the duration was 80 seconds. After cooling to room temperature, an imageable element (lithographic printing plate precursor) was obtained.

The same evaluations described for Invention Example 1 were done and the development results are shown above in TABLE II.

In a press run length test, the imageable element was subsequently exposed at 120 mJ/cm² at 15 watts and was used to provide 26,000 good impressions on a Miehle press with a wear ink containing 1.5% calcium carbonate.

Invention Example 3

The imageable layer coating composition B shown in TABLE I above was prepared to give a 5.6% w/w solution in a solvent mixture of 40% n-propanol, 25% PGME, 30% MEK, and 5% water. The resulting solution was applied to an electrochemically grained, sulfuric acid-anodized, aluminum-containing substrate that had been treated with a poly(vinyl phosphonic acid) (PVPA), using a slot coater at 2.5 cm³/ft² (26.9 cm³/m²) and dried to give a dry imageable layer coverage of 0.93 g/m². The coating drum temperature was 180° F. (82.2° C.) and the duration was 80 seconds. After cooling to room temperature, an imageable element (lithographic printing plate precursor) was obtained.

The same evaluations described for Invention Example 1 were done and the development results were shown above in TABLE II.

Invention Example 4

The imageable layer coating composition C shown above in TABLE I was prepared to give a 5.6% w/w solution in a solvent mixture of 35% n-propanol, 5% PGME, 30% MEK, and 30% water. The resulting solution was applied to an electrochemically grained, sulfuric acid-anodized, aluminum-containing substrate that had been treated with a poly(vinyl phosphonic acid) (PVPA), using a slot coater at 2.5 cm³/ft² (26.9 cm³/m²) and dried to give a dry imageable layer coverage of 0.93 g/m². The coating drum temperature was 180° F. (82.2° C.) and the duration was 80 seconds. After cooling to room temperature, an imageable element (lithographic printing plate precursor) was obtained.

The same evaluations described for Invention Example 1 were done and the development results were shown above in TABLE II.

Comparative Example 1

The imageable layer coating composition D shown above in TABLE I was prepared to give a 5.6% w/w solution in a solvent mixture of 40% n-propanol, 25% PGME, 30% MEK, and 5% water. The resulting solution was applied to an electrochemically grained, sulfuric acid-anodized, aluminum-containing substrate that had been treated with a poly(vinyl phosphonic acid) (PVPA), using a slot coater at 2.5 cm³/ft² (26.9 cm³/m²) and dried to give a dry imageable layer coverage of 0.93 g/m². The coating drum temperature was 180° F. (82.2° C.) and the duration was 80 seconds. After cooling to room temperature, an imageable element (lithographic plate precursor) was obtained.

The same evaluations described for Invention Example 1 were done and the development results were shown above in TABLE II.

Comparative Example 2

This example illustrates an imageable element similar to the inventive examples in EP 1,788,448. The results show that when the overcoat layer was omitted, no image was formed up to 400 mJ/cm² imaging energy.

An imageable layer formulation was prepared by dissolving LL02 or Alcotex 552P (3.72 g, 40% in water), IR Dye B (0.18 g), TBMPS (0.23 g), Monomer A (2.05 g), and Byk® 336 (0.04 g, 10% in PGME) in 39.1 g of PGME. An electrochemically-grained and sulfuric acid-anodized aluminum substrate that had been post-treated with poly(vinyl phosphonic acid) was coated with this imageable layer formulation at a dry coating weight of about 1.6 g/m². The resulting imageable element was placed on a Kodak® Trendsetter 3244x image setter and exposed to an 830 nm IR laser between 100 and 400 mJ/cm². The imaged elements were then directly mounted on an ABDick duplicator press charged with Van Son rubber-based black ink. The fountain solution was Vam 142W etch at 3 oz per gallon (23.4 ml/l) and PAR alcohol replacement at 3 oz per gallon (23/4 ml/l). No obvious image was obtained on printed sheets.

Invention Example 5

The imageable layer coating composition E shown above in TABLE I was prepared to give a 6.2% w/w solution in a solvent mixture of 55% PGME, 35% MEK, and 10% water. The resulting solution was applied to an electrochemically grained, sulfuric acid-anodized, aluminum-containing substrate that had been treated with a poly(vinyl phosphonic acid) (PVPA) using a slot coater at 2.2 cm³/ft² and dried to give a dry imageable layer coverage of 1.3 g/m². The coating drum temperature was 180° F. (82.2° C.) and the duration was 80 seconds. After cooling to room temperature, an imageable element (printing plate precursor) was obtained.

Samples of the element were treated under various conditions in order to accelerate the effects of plate ageing. In one test, elements were wrapped in interleaving and foil and then treated for 5 days at 48° C. (dry aging test). In another test, elements were hung in a humidity chamber for 5 days at 38° C. and 80% relative humidity (humidity aging test). In yet another test, the elements were placed at room temperature in dark (inside a cardboard box) for 5-10 days (natural aging test).

After the various aging conditions (natural, dry and humidity aging), all elements were imagewise exposed to a 830 nm IR laser at a drum speed of 250 rpm and varying power from 4 to 16 watts on a Kodak® Trendsetter 3244x imagesetter, and were then developed in an NE 34 processor (from Kodak) containing 955 Developer at 23° C. The minimum energy to achieve a stable solid density and clean background was about 65 mJ/cm². The development of the plates was assessed and the results are shown in TABLE II above.

Another sample of the resulting imageable element was exposed at 110 mJ/cm² on the Kodak® Trendsetter 3244x image setter and was developed in an NE34 processor containing 955 Developer at 5 ft/minute (1.5 m/minute) at 23° C. The imaged and processed element was then mounted onto a Komori sheet-fed press using a wear ink containing 1.5% calcium carbonate to produce about 70,000 good impressions.

Comparative Example 3

The imageable layer coating composition F shown above in TABLE I was prepared to give a 5.74% w/w solution in a solvent mixture of 55% PGME, 35% MEK, and 10% water. The resulting solution was applied to an electrochemically grained, sulfuric acid-anodized, aluminum-containing substrate that had been treated with a poly(vinyl phosphonic acid) (PVPA) using a slot coater at 2.2 cm³/ft² (26.9 cm³/m²) and dried to give a dry imageable layer coverage of 1.2 g/m². The coating drum temperature was 180° F. (82.2° C.) and the duration was 80 seconds. After cooling to room temperature, an imageable element (lithographic printing plate precursor) was obtained.

Samples of the element were treated under various conditions in order to accelerate the effects of plate aging as described above.

After the various aging conditions (natural, dry and humidity aging), all elements were imagewise exposed to a 830 nm IR laser at a drum speed of 250 rpm and varying power from 4 to 16 watts on a Kodak® Trendsetter 3244x imagesetter, and was developed in an NE 34 processor (from Kodak) containing 955 Developer at 23° C. The minimum energy to achieve a stable solid density and clean background was about 65 mJ/cm². The development of the plates was assessed by visually evaluation and the results are shown in TABLE II.

Another sample of the resulting imageable element was exposed at 110 mJ/cm² on the Kodak® Trendsetter 3244x image setter and was developed in an NE34 processor containing 955 Developer at 5 ft/minute (1.5 m/minute) at 23° C. The imaged and processed element was then mounted onto a Miehle sheet-fed press using a wear ink containing 1.5% calcium carbonate to produce about 50,000 good impressions.

Invention Example 6

The imageable layer coating composition containing SR-494 (10.1%), Graft polymer A (37.9%), Initiator A (5.1%), Irgacure® 250 (2.8%), LL02 (14.2%), IR dye A (3.7%), Byk® 336 (2.1%), Sipomer PAM-100 (1.4%), Oligomer A (13.6%), Blue-63 (3.7%) and PEGDA (5.5%) was prepared to give a 5.6% w/w solution in a solvent mixture of 40% n-propanol, 25% PGME, 30% MEK, and 5% water. The resulting solution was applied to an electrochemically grained, phosphoric acid-anodized, aluminum-containing substrate that had been treated with a poly(acrylic acid) solution, using a slot coater at 2.5 cm³/ft² (26.9 cm³/m²) and dried to give a dry imageable layer coverage of 0.93 g/m². The coating drum temperature was 180° F. (82.2° C.) and the duration was 80 seconds. After cooling to room temperature, an imageable element (lithographic printing plate precursor) was obtained.

Samples of the imageable element were treated under various conditions in order to accelerate the effects of ageing. In one test, the elements were wrapped in interleaving and foil and then treated for 5 days at 48° C. (dry aging test). In another case, elements were hung in a humidity chamber for 5 days at 38° C. and 80% relative humidity (humidity aging test). In yet another test, the elements were placed at room temperature in dark (inside a cardboard box) for 5-10 days (natural aging test).

After various aging conditions (natural, dry and humidity aging), all of the elements were exposed from 50 to 125 mJ/cm² on a Kodak® Trendsetter 3244x image setter. The imaged elements were then directly mounted on an ABDick duplicator press charged with Van Son rubber-based black ink. The fountain solution was Vam 142W etch at 3 oz per gallon (23.4 ml/l) and PAR alcohol replacement at 3 oz per gallon (23.4 ml/l). The press was run for 200 good impressions with clean background on all three plates from natural-aging, dry-aging and humidity-aging tests.

The invention has been described in detail with particular reference to certain preferred embodiments thereof, but it will be understood that variations and modifications can be effected within the spirit and scope of the invention.

The invention claimed is:

1. A negative-working imageable element comprising a sulfuric acid-anodized aluminum-containing substrate having directly thereon an imageable layer as the outermost layer, said imageable layer comprising:
a free radically polymerizable component, an initiator composition capable of generating radicals sufficient to initiate polymerization of said free radically polymerizable component upon exposure to imaging radiation,
an infrared radiation absorbing compound,
a primary polymeric binder that can be optionally present as discrete particles, wherein said primary polymeric binder is soluble in an alkaline solution and has an acid value of from about 20 to about 400, and said imageable element is off-press developable, and
a secondary polymeric binder comprising a polyvinyl acetate) that has a degree of hydrolysis of less than 60 mol %.

2. The element of claim 1 wherein said primary polymeric binder is present in an amount of at least 5 and up to 70 weight %, and said secondary polymeric binder is present in an amount of at least 1 and up to 40 weight %, both based on total dry imageable layer weight.

3. The element of claim 1 wherein said secondary polymeric binder has a degree of hydrolysis of at least 10 mol % and less than 60 mol %.

4. The element of claim 1 wherein said secondary polymeric binder can be represented by the following Structure (PVAc):

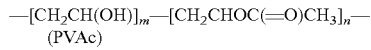

wherein m is less than 60 mol % and m+n=100%.

5. The element of claim 1 wherein said free radically polymerizable component comprises an ethylenically unsaturated free-radical polymerizable monomer or oligomer, or a free-radical crosslinkable polymer.

6. The element of claim 1 wherein said initiator composition comprises an onium salt.

7. The element of claim 6 wherein said onium salt is an iodonium borate comprising a diaryliodonium borate compound represented by the following Structure (II):

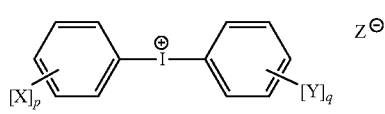

wherein X and Y are independently halo, alkyl, alkyloxy, or cycloalkyl groups or two or more adjacent X or Y groups can be combined to form a fused ring with the respective phenyl rings, p and q are independently 0 or integers of 1 to 5, provided that either p or q is from about 1, and
$Z^-$ is an organic anion represented by the following Structure (III):

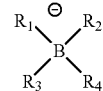

wherein $R_1$, $R_2$, $R_3$, and $R_4$ are independently alkyl, aryl, alkenyl, alkynyl, cycloalkyl, or heterocyclyl groups, or two or more of $R_1$, $R_2$, $R_3$, and $R_4$ can be joined together to form a heterocyclic ring with the boron atom.

8. A method of making an imaged element comprising:
A) imagewise exposing the negative-working imageable element of claim 1 to form exposed and non-exposed regions,
B) with or without a preheat step, developing said imagewise exposed element to remove predominantly only said non-exposed regions,
said development being carried out off-press using a processing solution.

9. The method of claim 8 wherein said imageable element contains an IR-sensitive dye and said imagewise exposing step A is carried out using radiation having a maximum wavelength of from about 700 to about 1200 nm at an energy level of from about 20 to about 500 mJ/cm$^2$.

10. The method of claim 8 wherein said imageable element comprises a secondary polymeric binder that can be represented by the following Structure (PVAc):

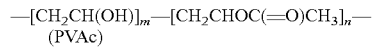

wherein m is less than 60 mol % and m+n=100%.

11. The method of claim 8 wherein the outermost imageable layer is directly disposed on the sulfuric acid-anodized aluminum-containing substrate, and the outermost imageable layer comprises a free radically polymerizable component, an iodonium salt, an infrared radiation absorbing dye, a primary polymeric binder that is present as discrete particles throughout the imageable layer, and a secondary polymeric binder that is a poly(vinyl acetate) having a degree of hydrolysis of at least 30 mol % and less than 60 mol %, and wherein said imageable element is imagewise exposed using infrared radiation and is developed off-press using an alkaline processing solution having a pH greater than 7.

12. The method of claim 8 wherein the outermost imageable layer is directly disposed on the sulfuric acid-anodized aluminum-containing substrate and comprises a free radically polymerizable component, an iodonium salt, an infrared radiation absorbing dye, a primary polymeric binder that is a non-particulate (meth)acrylic acid copolymer, and a secondary polymeric binder that is a poly(vinyl acetate) having a degree of hydrolysis of at least 30 mol % and less than 60 mol %, and wherein said imageable element is imagewise exposed using infrared radiation and is developed off-press using a processing solution that has a pH of at least 2 and up to and including 11, and that also provides a protective layer over the imaged and developed surface.

* * * * *